(12) United States Patent
Halpern

(10) Patent No.: US 8,487,229 B2
(45) Date of Patent: Jul. 16, 2013

(54) PORTABLE, DURABLE, INTEGRATED SOLAR POWER GENERATION DEVICE

(75) Inventor: Jason Halpern, Collingswood, NJ (US)

(73) Assignee: Gridless Power Corporation, Collingswood, NJ (US)

(*) Notice: Subject to any disclaimer, the term of this patent is extended or adjusted under 35 U.S.C. 154(b) by 646 days.

(21) Appl. No.: 12/622,821

(22) Filed: Nov. 20, 2009

(65) Prior Publication Data

US 2010/0122722 A1    May 20, 2010

Related U.S. Application Data

(60) Provisional application No. 61/116,561, filed on Nov. 20, 2008.

(51) Int. Cl.
*G01C 21/02* (2006.01)
*F24J 2/40* (2006.01)
*H02N 6/00* (2006.01)

(52) U.S. Cl.
USPC .................. 250/203.4; 126/572; 136/245

(58) Field of Classification Search
USPC ............ 250/203.4; 126/571–574, 600–601, 126/686, 690, 691; 136/206, 214, 244, 245
See application file for complete search history.

(56) References Cited

U.S. PATENT DOCUMENTS

| | | | |
|---|---|---|---|
| 5,699,785 A | 12/1997 | Sparkman | |
| 6,363,928 B1 * | 4/2002 | Anderson, Jr. | 126/577 |
| 6,953,038 B1 | 10/2005 | Nohrig | |
| 2003/0221717 A1 | 12/2003 | Dessel | |
| 2007/0113882 A1 | 5/2007 | Meyers | |
| 2007/0199563 A1 | 8/2007 | Fox | |
| 2007/0235071 A1 | 10/2007 | Work et al. | |
| 2007/0251569 A1 | 11/2007 | Shan et al. | |

FOREIGN PATENT DOCUMENTS

| | | |
|---|---|---|
| WO | 2007146183 A2 | 12/2007 |
| WO | 2008000282 A1 | 1/2008 |

* cited by examiner

*Primary Examiner* — Que T Le
*Assistant Examiner* — Don Williams
(74) *Attorney, Agent, or Firm* — Pepper Hamilton, LLP

(57) ABSTRACT

A solar power generation device including a base, a tracking system mounted to the base, a solar collector mounted to the tracking system configured to open as the solar power generation device transitions to an active state and to close as the solar power generation device transitions to an inactive state, a light sensing system dynamically mounted about the base and configured to adjust the tracking system based upon the position of a light producing element, and a plurality of focusing elements mounted to the base and positioned around the light sensing system such that any light reflected by the focusing elements is directed to the solar collector. The device may further include an electricity management and conditioning system contained in the base that includes a short term storage system, a long term storage system, a data acquisition system, and a data and electricity transmission interface.

20 Claims, 22 Drawing Sheets

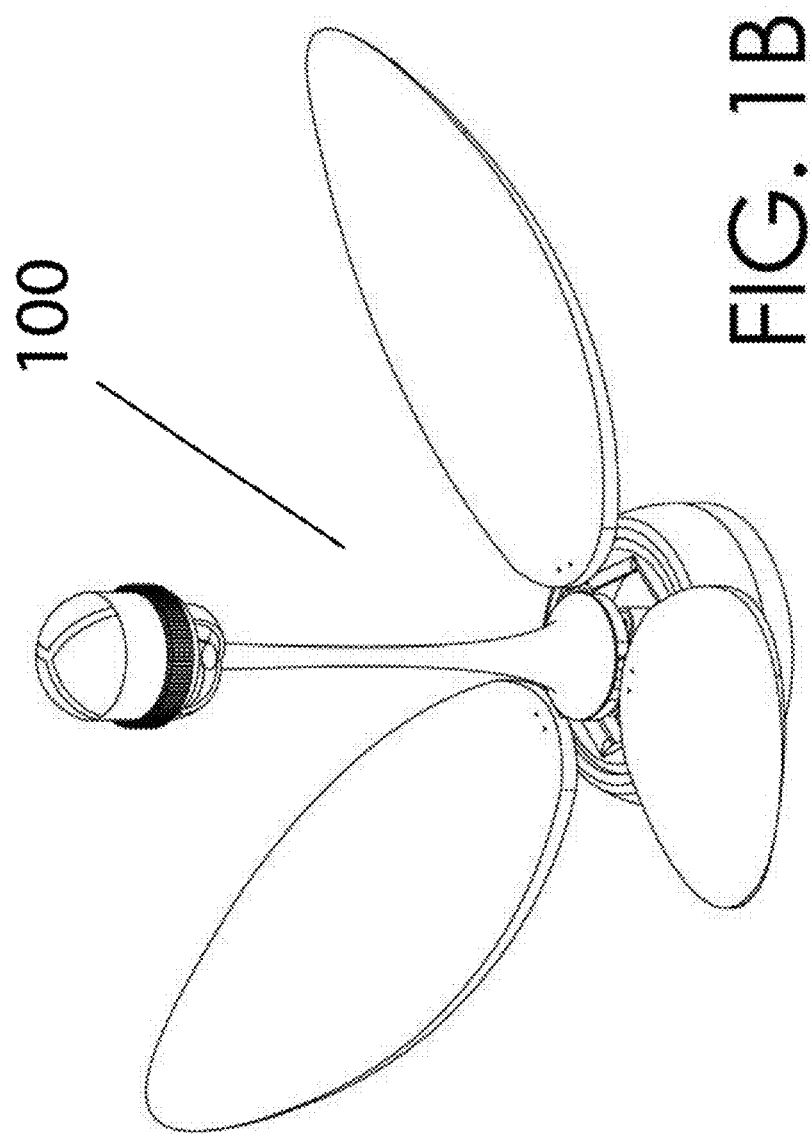

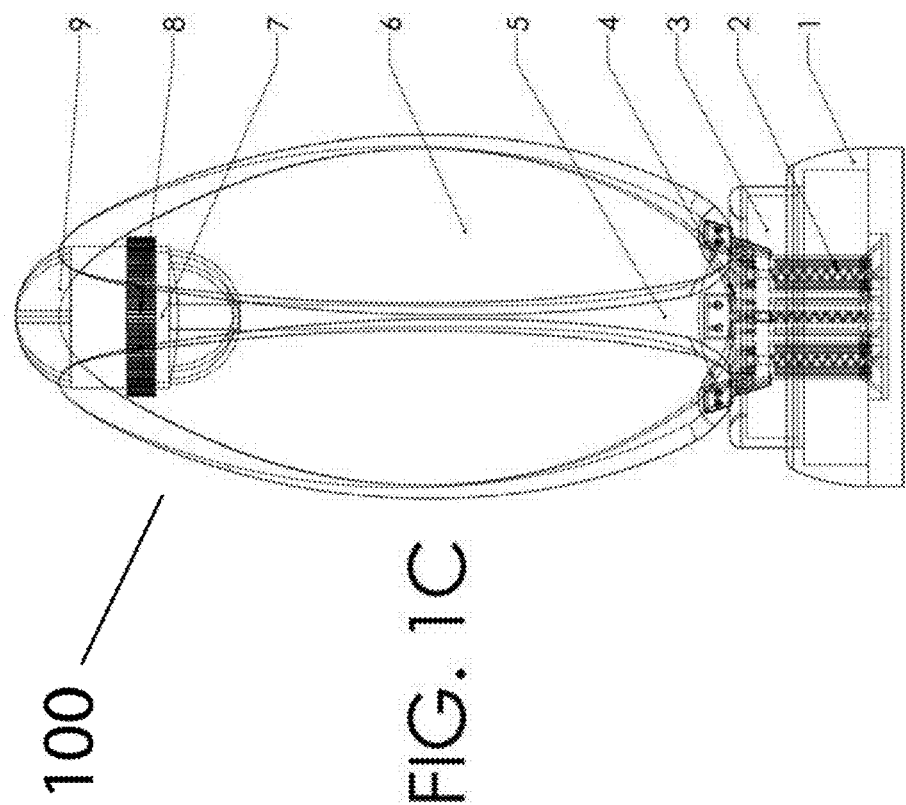

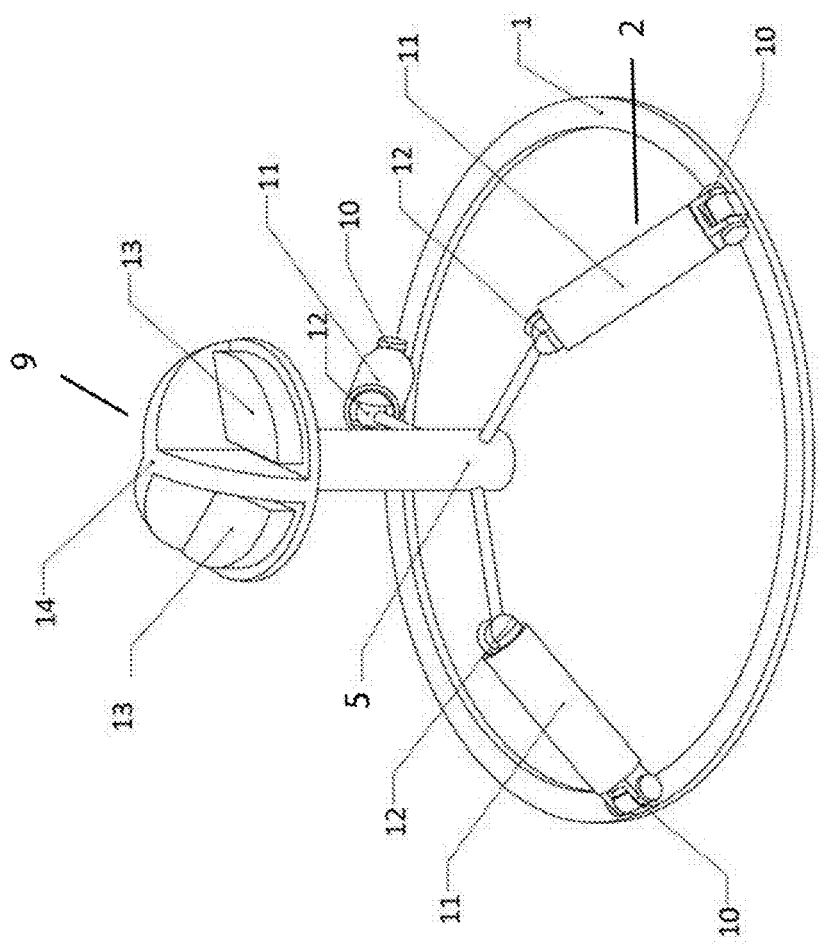

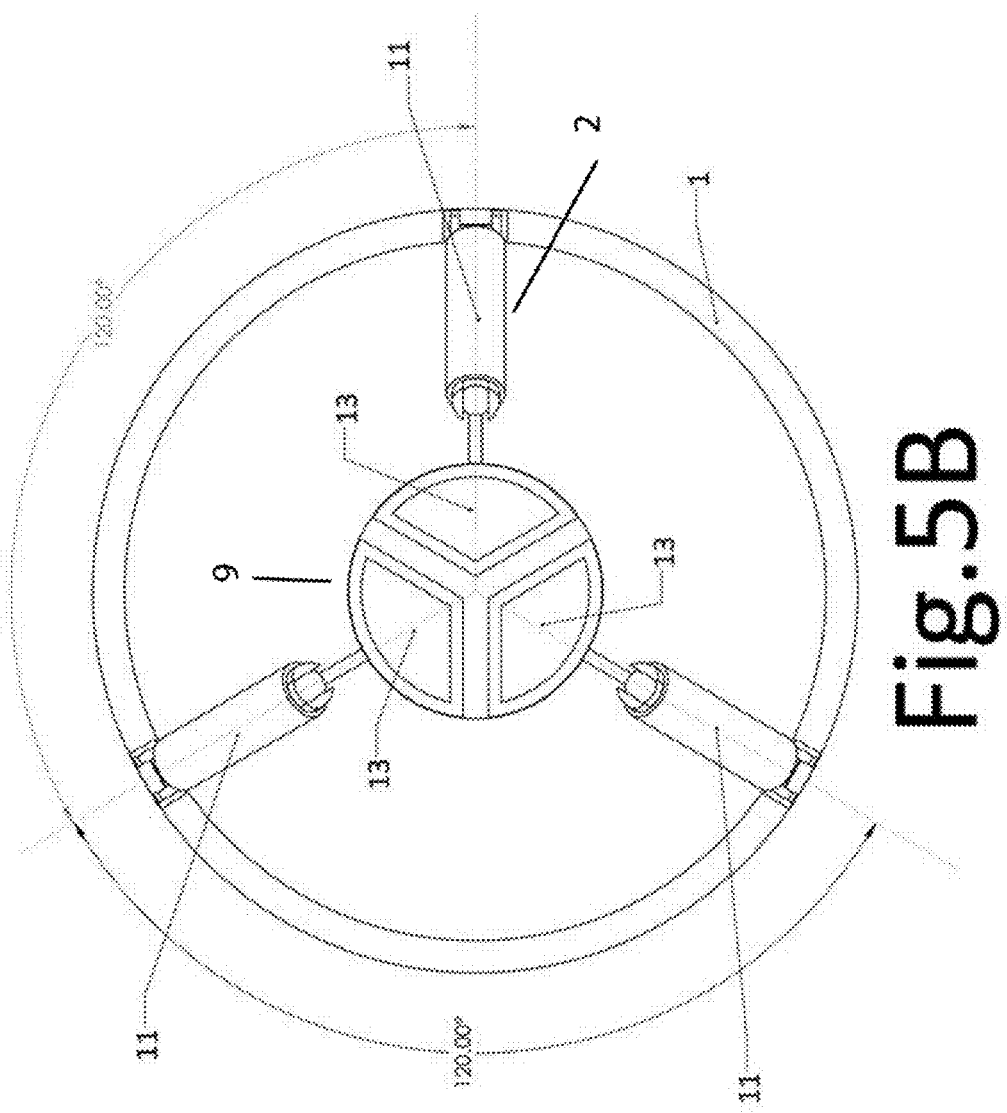

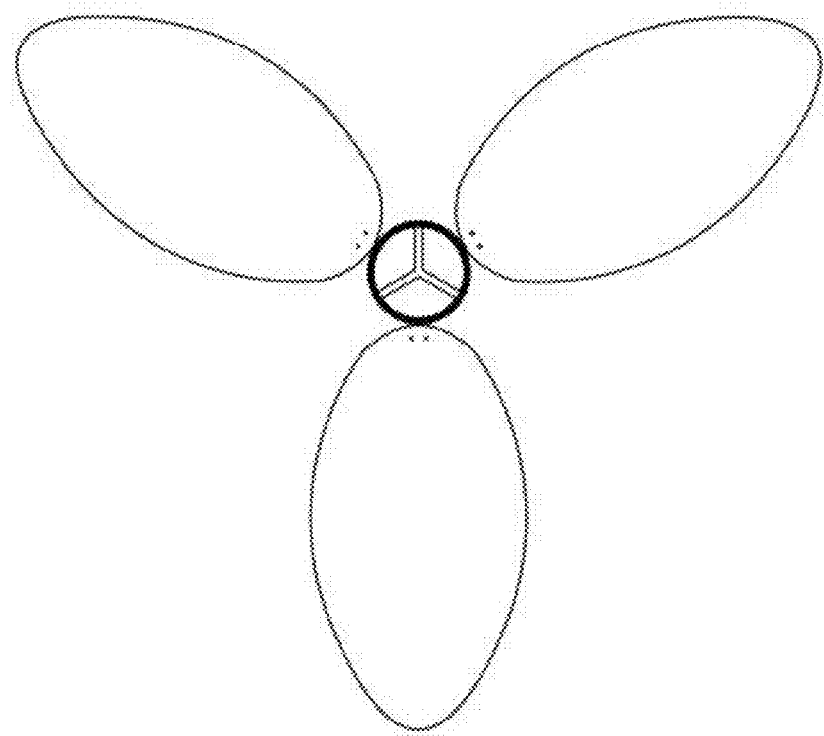
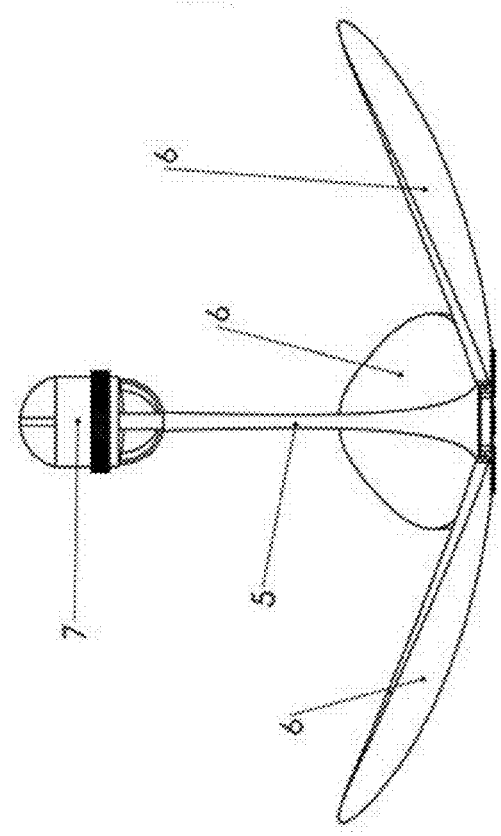
FIG. 7A
FIG. 7B

PORTABLE, DURABLE, INTEGRATED SOLAR POWER GENERATION DEVICE

RELATED APPLICATION AND CLAIM OF PRIORITY

This application claims the priority benefit of U.S. Provisional Application No. 61/116,561 filed Nov. 20, 2008, which is hereby incorporated by reference in its entirety.

BACKGROUND

This document relates to portable power generator. More specifically, the present disclosure relates to a portable solar power generator.

Solar power offers a number of advantages. For example, solar power offers the promise of clean, renewable energy. In addition, solar power may be generated wherever solar radiation is available. Thus, solar power may facilitate a decentralized energy system by enabling electricity to be generated at or near the point of consumption. Moreover, solar power may be generated without the use of hydrocarbons, thereby reducing our dependence on fossil fuels.

In Concentrated Photovoltaics (CPV), light from the sun is focused onto high-efficiency solar cells, which offer several additional advantages. High-efficiency solar cells require less silicon, and can achieve higher efficiencies than traditional solar panels. Thus, devices that utilize high-efficiency solar cells are generally more economical and require less space. However, to date, developments in concentrated solar power generation have failed to address certain needs of the end user, and do not take full advantage of solar energy's beneficial characteristics.

In particular, existing solar installations are generally permanent, while many possible uses of solar energy require temporary installations. As an example, in the agricultural sector, a farmer may want to harvest solar power during a certain period of time over which a field would otherwise go unused. The permanence of existing installations makes such a use unfeasible due to the lengthy and costly installation process. In addition, many of the current solar technologies cannot withstand harsh operating environments. The critical functional surfaces on solar generators (e.g., mirrors, lenses, glass coverings, solar panels and/or cells) that are frequently exposed to dust or chemicals, for example, may become damaged or coated by dust or other debris, thus reducing overall effectiveness. Moreover, existing installations are often very complex, typically requiring a large amount time to install by trained experts. What is needed is a portable or semi-portable solar power generation device, capable of rapid scaled deployment by an end user of the electricity or an independent electricity generator.

SUMMARY

Before the present methods are described, it is to be understood that this invention is not limited to the particular systems, methodologies or protocols described, as these may vary. It is also to be understood that the terminology used herein is for the purpose of describing particular embodiments only, and is not intended to limit the scope of the present disclosure which will be limited only by the appended claims.

It must be noted that as used herein and in the appended claims, the singular forms "a," "an," and "the" include plural reference unless the context clearly dictates otherwise. Thus, for example, reference to a "coil" is a reference to one or more coils and equivalents thereof known to those skilled in the art, and so forth. Unless defined otherwise, all technical and scientific terms used herein have the same meanings as commonly understood by one of ordinary skill in the art. As used herein, the term "comprising" means "including, but not limited to."

In one general respect, the embodiments disclose an easily transported and self-protecting solar power generation device. The solar power generation device includes a base, a tracking system mounted to the base, and a solar collector mounted to the tracking system configured to open as the solar power generation device transitions to an active state and to close as the solar power generation device transitions to an inactive state.

In another general respect, the embodiments disclose a solar power generation device. The solar power generation device includes a base, a tracking system mounted to the base, a solar collector mounted to the tracking system configured to open as the solar power generation device transitions to an active state and to close as the solar power generation device transitions to an inactive state, a light sensing system dynamically mounted about the base and configured to adjust the tracking system based upon the position of a light producing element, and a plurality of focusing elements mounted to the base and positioned around the light sensing system such that any light reflected by the focusing elements is directed to the solar collector.

BRIEF DESCRIPTION OF THE DRAWINGS

Aspects, features, benefits and advantages of the present invention will be apparent with regard to the following description and accompanying drawings, of which:

FIGS. 1A and 1B illustrate perspective views of an exemplary solar power generation device in a closed state and an open state according to an embodiment.

FIGS. 1C and 1D illustrate side views of the exemplary solar power generation device in the closed state and the open state according to an embodiment;

FIGS. 5A and 5B illustrate perspective and top views, respectively, of a tracking system and a light sensing system of the exemplary solar power generation device according to an embodiment;

FIGS. 7A and 7B illustrate side and top views, respectively, of a support and focusing elements of the exemplary solar power generation device according to an embodiment;

DETAILED DESCRIPTION

Figure 1A:
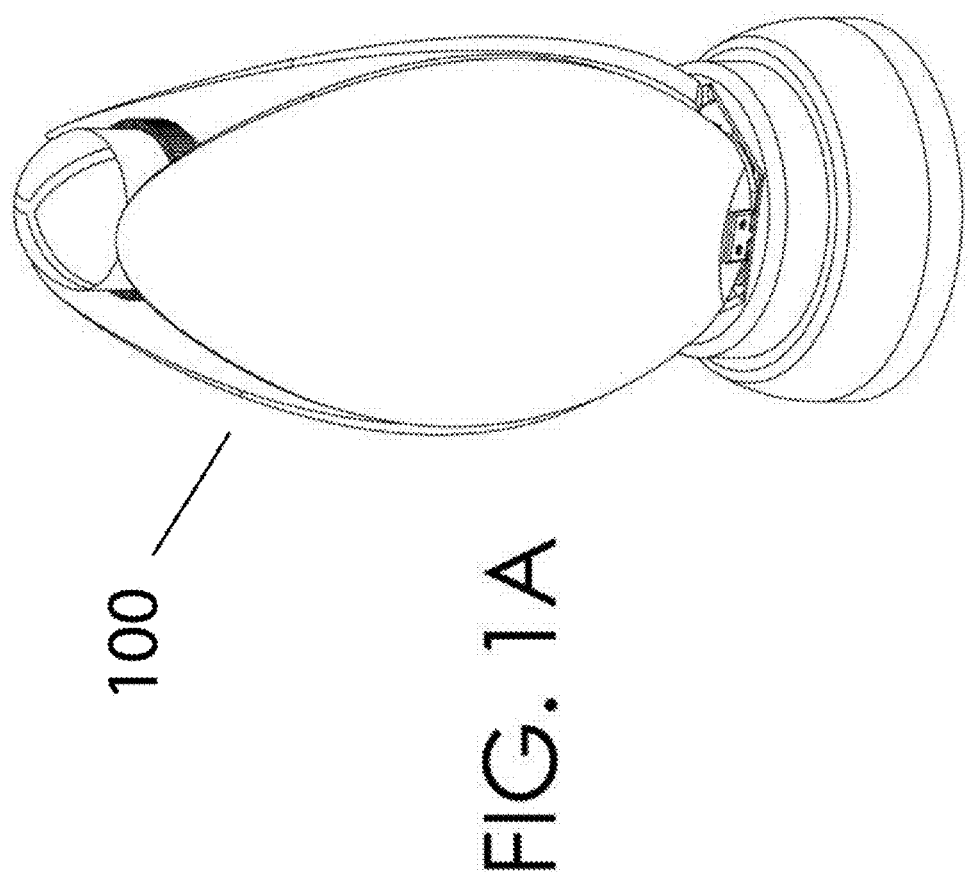

FIGS. 1A-1F illustrate the overall structure of an exemplary solar power generation device 100 for generating electricity from solar radiation or an artificial light source. The solar power generation device 100 may be deployed outdoors in a variety of operating environments and conditions. The solar power generation device 100 may preferably be located in areas that receive direct radiation from the sun. As shown in FIG. 1C, the solar power generation device 100 may include a base 1, a tracking system 2, a focus element actuation system 3, and a moving frame 4. The solar power generation device 100 may also include a support 5, one or more focusing elements 6, a collector 7, a heat dissipation system 8, and a light sensing system 9.

Figure 2:
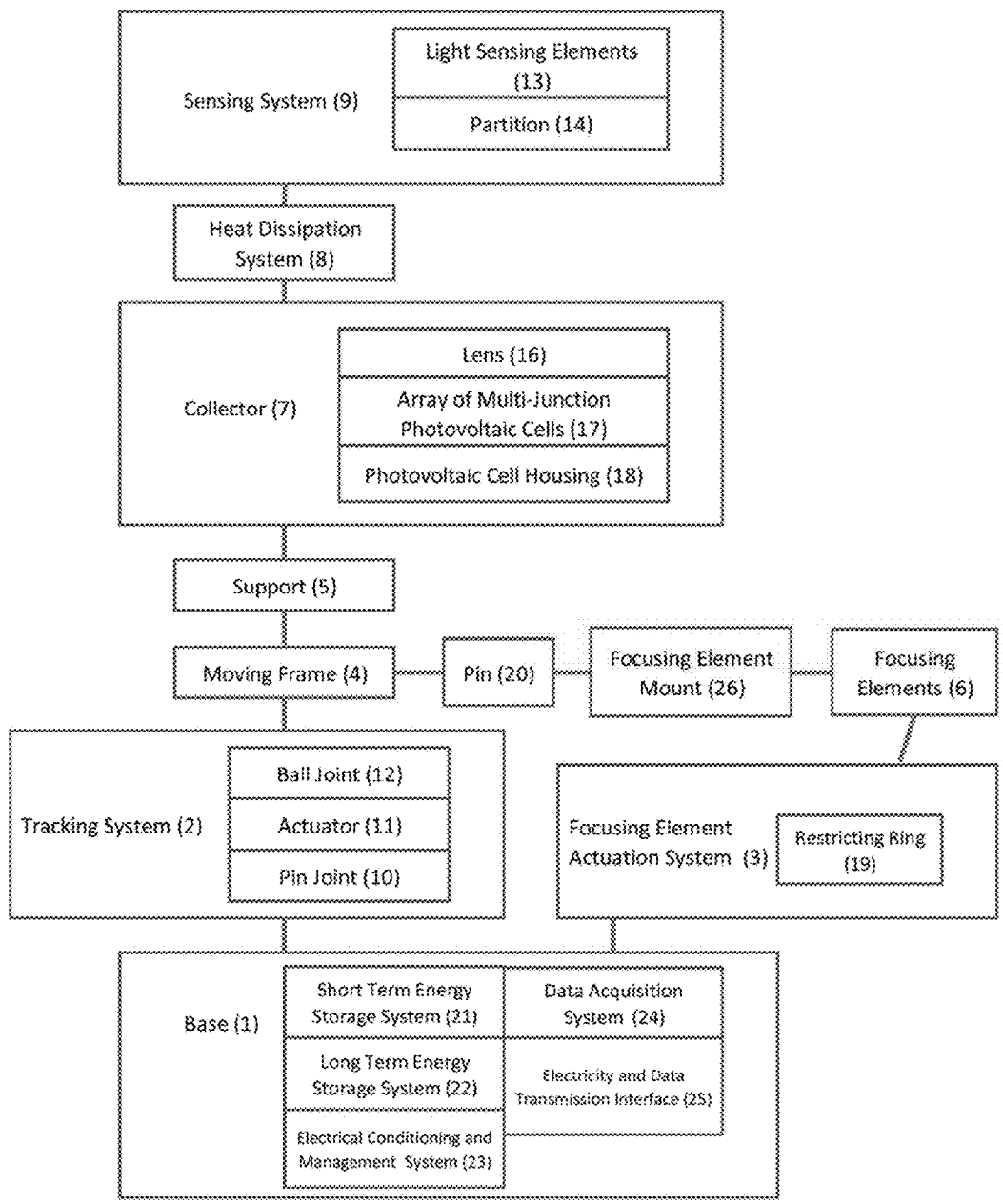
FIG. 2 illustrates a system diagram of the exemplary solar power generation device according to an embodiment.

FIG. 2 is an exemplary system diagram of the solar power generation device 100. As shown in the exemplary embodiment illustrated in FIG. 2, the base 1 of the solar power generation device 100 may house a short-term energy storage system 21, a long-term energy storage system 22, an electrical conditioning and management system 23, a data acquisition system 24, and an electricity and data transmission interface 25. The tracking system 2 may include one or more pin joints 10, one or more actuators 11, and one or more ball joints 12. The focusing element actuation system 3 may include a restriction ring 19, or alternatively, a dynamic mechanical system used to actuate movement of the focusing elements 6. The collector 7 may include an array of solar or photovoltaic cells 17, for example multi-junction photovoltaic cells, and a photovoltaic cell housing 18. Depending on the arrangement and implementation of the solar power generation device, the collector 7 may further include one or more lenses 16. The light sensing system 9 may include light sensing elements 13 and a partition 14. The focusing elements 6 may be mounted or attached to the moving frame 4 via one or more focusing element mounts 26 and pins 20.

Figure 3:
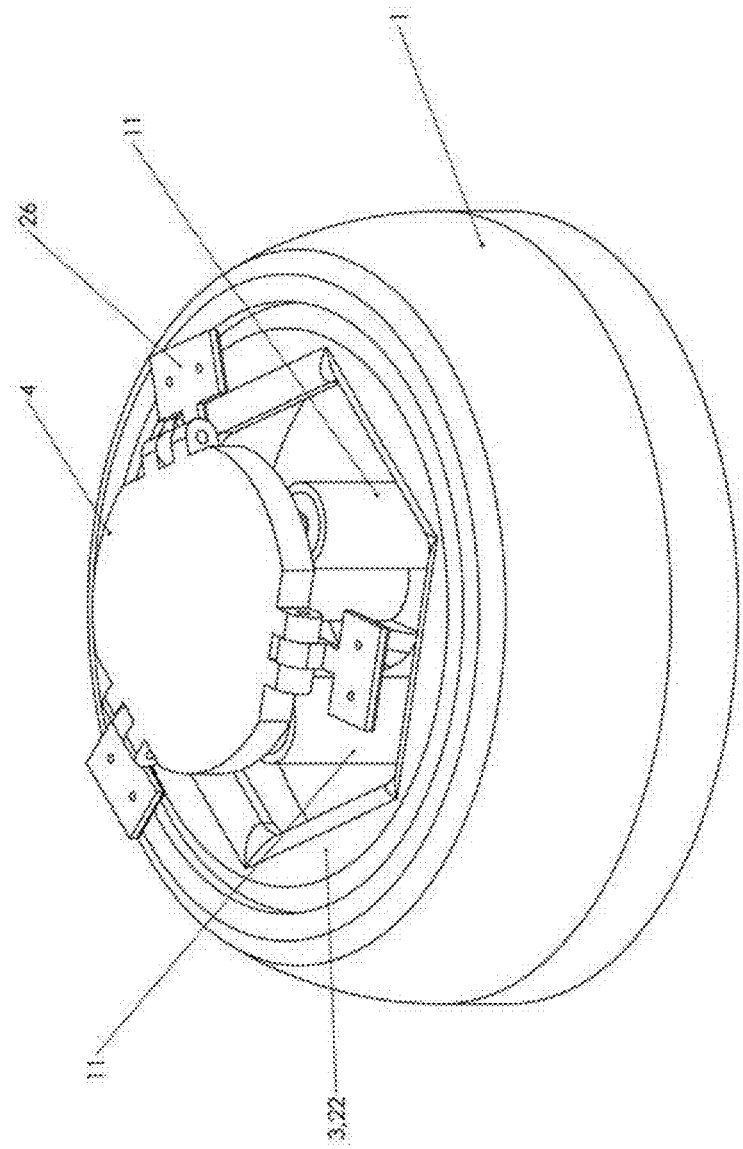
FIG. 3 illustrates a perspective view of a base of the exemplary solar power generation device according to an embodiment.

FIG. 3 is a perspective view of the base 1. In one embodiment, the base 1 may be a single rigid or flexible structure capable of supporting the dynamic loads applied throughout the motion of the solar power generation device 100. Alternatively, the base 1 may be constructed from multiple rigid or flexible structures. As noted above, the base 1 may house the electricity conditioning and management system 23, the short-term energy storage system 21, the long-term energy storage system 22, the data acquisition system 24, and the electricity and data transmission interface 25. In another embodiment, the base 1 may house components of the heat dissipation system 8. It will be appreciated that the base 1 may house one, or any combination of two or more, of the foregoing systems.

Figure 4A:
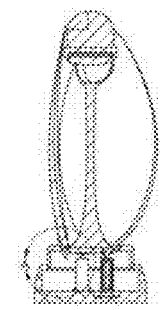
FIGS. 4A-4F illustrate illustrations of the exemplary solar power generation device transitioning from the closed state to the open state according to an embodiment.
Figure 4D:
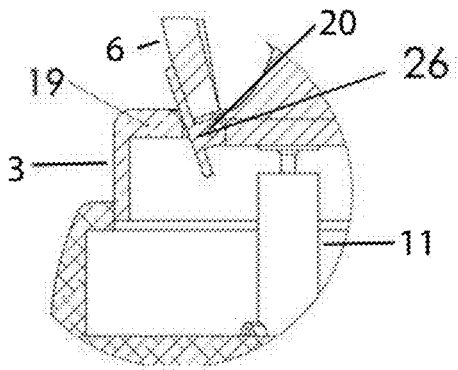
Figure 4B:
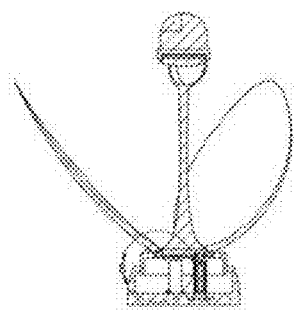
Figure 4E:
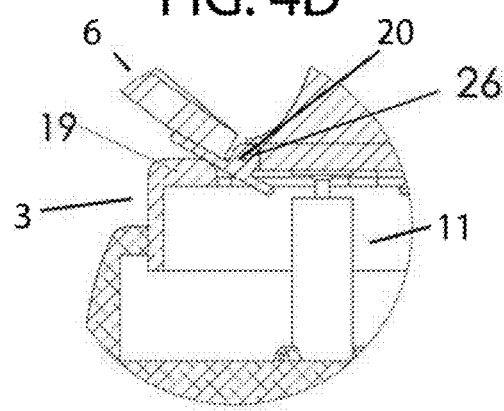
Figure 4C:
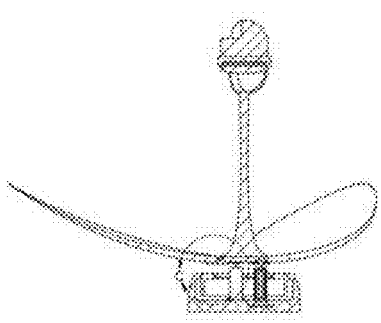
Figure 4F:
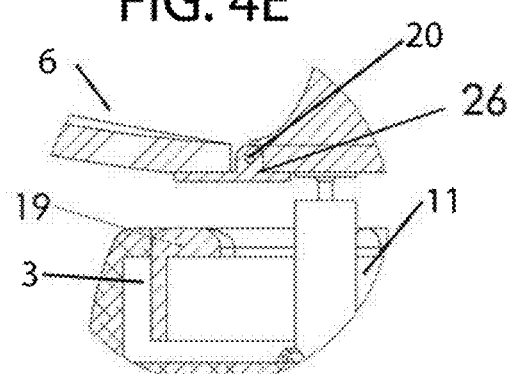

FIGS. 4A-4C are side views of the solar power generation device 100 transitioning from a closed state to an open state. FIGS. 4D-4F are cross-sectional views of a portion of the base 1 and the focusing actuation system 3 as the solar power generation device 100 transitions from the closed state to the open state. As shown in FIGS. 4A-4F, the focusing actuation system 3 may be connected to the base 1. The focusing actuation system 3 may include the restriction ring 19 and focusing element mounts 26. Each focusing element mount 26 may be attached to the moving frame 4 via the pin 20. The focusing actuation system 3 may include one or more mechanisms for lowering and raising the restriction ring 19, thereby causing the focusing elements 6 to open and close. For example, the solar power generation device 100 may include an electric motor connected to a mechanical linkage that transfers the rotary motion of the motor into linear motion of the restriction ring 19. Alternatively, the mechanisms for lowering and raising the restriction ring 19 may utilize a hydraulic, pneumatics, and/or a mechanical actuator.

In another embodiment, the focusing actuation system 3 may be attached to different components of the solar power generation device 100, such as the moving frame 4.

FIGS. 5A and 5B are perspective and top views, respectively, of the tracking system 2, which may be attached to the base 1. The tracking system 2 may include three actuators 11 arranged in a circular pattern, though any number of actuators 11 may be used. Each actuator 11 may be attached to the base 1 by a single degree of freedom pin joint 10.

Figure 6:
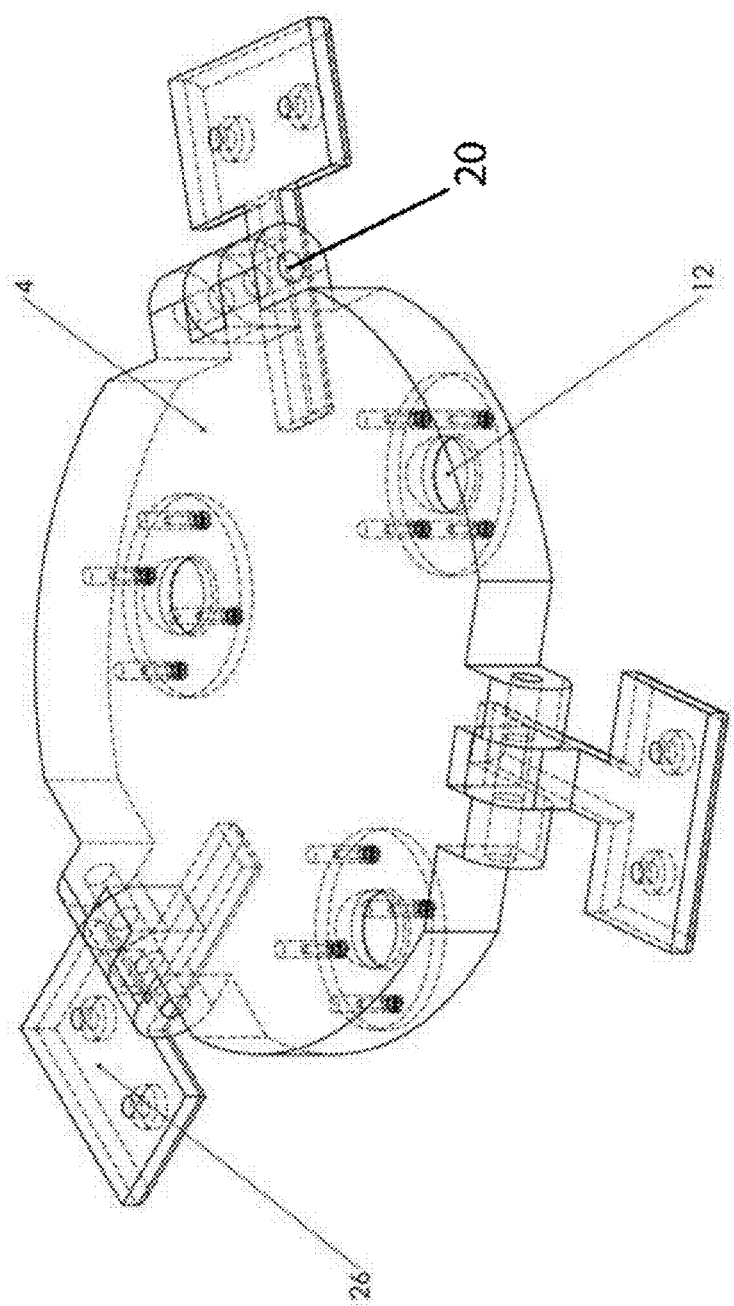
FIG. 6 illustrates a perspective view of a moving frame of the exemplary solar power generation device according to an embodiment.

FIG. 6 is a perspective view of the moving frame 4. As noted above, the actuators 11 may be attached to the moving frame 4 via one or more ball joints 12. The support 5 (not shown) may be attached to the moving frame 4, and may extend generally perpendicular to the planar surface of the moving frame 4. In addition, the focusing elements 6 may be attached to the moving frame 4 via focusing element mounts 26, and each focusing element mount 26 may be attached to the moving frame 4 via the pin 20. The focusing elements 6 may be attached to the focusing element mounts 26 in any suitable manner that permits the focusing elements 6 to transition between an open and closed position. In another embodiment, the connection may be fixed and, therefore, may not allow for movement of the focusing elements 6. In yet another embodiment, the focusing elements 6 may be attached to other components of the solar power generation device 100.

FIGS. 7A and 7B show side and top views, respectively, of the focusing elements 6 and the collector 7. Each of the focusing elements 6 may be a section of a parabolic mirror. Each of the focusing elements 6 may be made from steel, though it will be appreciated that the focusing elements 6 may be made of any suitable material, with or without a coating, that provides adequate optical properties. Each of the focusing elements 6 may include an optical manipulator, such as lenses, prisms, or any solid, liquid, or gas, exhibiting similar properties. The focusing elements 6 may define a smooth parabolic curve with the focus of the curve at a point on the collector 7. Alternatively, the focusing elements 6 may include a series of discontinued surfaces with the focus of each surface at a point on the collector 7.

The solar power generation device 100 may include three focusing elements 6, though any number of focusing elements 6 may be used. Each of the focusing elements 6 may be attached to the moving frame 4, and may define a petal-like shape. In alternate embodiments, the focusing elements 6 may define any suitable shape or geometry. The focusing elements 6 may be configured in any suitable orientation that provides adequate light concentration to the collector 7. In other embodiments, the solar power generation device 100 may not utilize the focusing elements 6. Instead, the solar power generation device 100 may include energy conversion systems that do not require focused solar radiation.

FIG. 7A also depicts a side view of the support 5, which may be attached to the moving frame 4. The support 5 may include a single column, though it will be appreciated that the support 5 may have any suitable physical configuration capable of serving the same or similar purpose.

Figure 8:
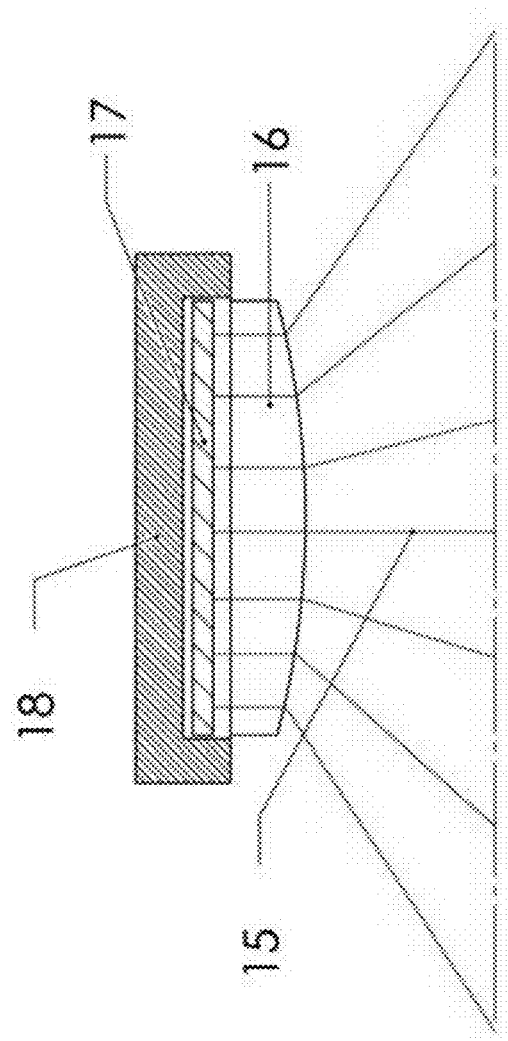
FIG. 8 illustrates a detailed view of a collector of the exemplary solar power generation device according to an embodiment.

FIG. 8 is a detailed view of the collector 7, which may be attached to the support 5. The collector 7 may include one or more lenses 16, the array of photovoltaic cells 17, and the photovoltaic cell housing 18. The lenses 16 may focus solar radiation 15 onto the array of photovoltaic cells 17, which may be housed within the photovoltaic cell housing 18. The photovoltaic cells 17 may be oriented in the cell housing 18 in various manners such as oriented at an angle toward the center of the collector 7 to maximize the amount of light captured, or other arrangements such as a cone or hemisphere. The lenses 16 may have a fixed or variable focal length positioned in front of the array of photovoltaic cells 17. Alternatively, the collector 7 may include any type of system (e.g., a heat engine) that converts solar radiation into another form of energy.

Figure 9B:
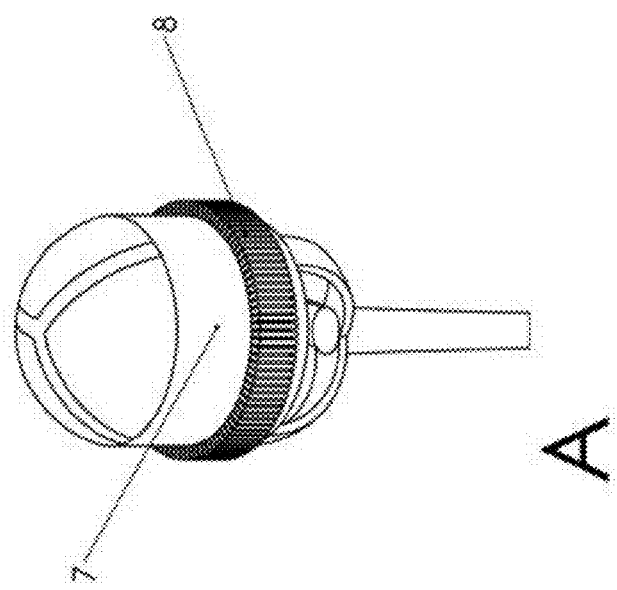
FIGS. 9A and 9B illustrate perspective and detailed views, respectively, of a heat dissipation system of the exemplary solar power generation device according to an embodiment.
Figure 9A:
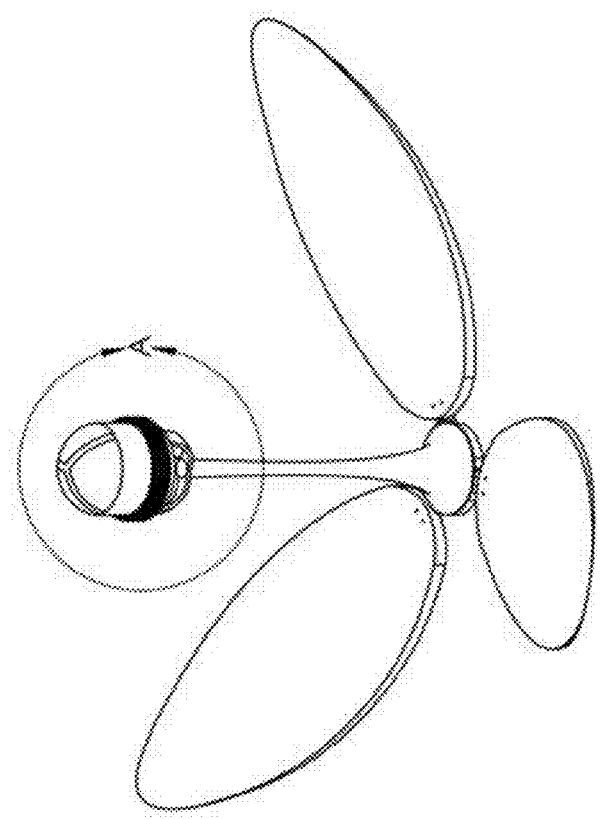

FIGS. 9A and 9B are perspective views of the heat dissipation system 8, which may be attached to the collector 7. In alternative embodiments, the heat dissipation system 8 may be housed in the base 1. The heat dissipation system 8 may be a heat sink made of metal, though it will be appreciated that the heat dissipation system 8 may be any active or passive component or system that dissipates thermal energy from the solar power generation device 100.

Figure 10B:
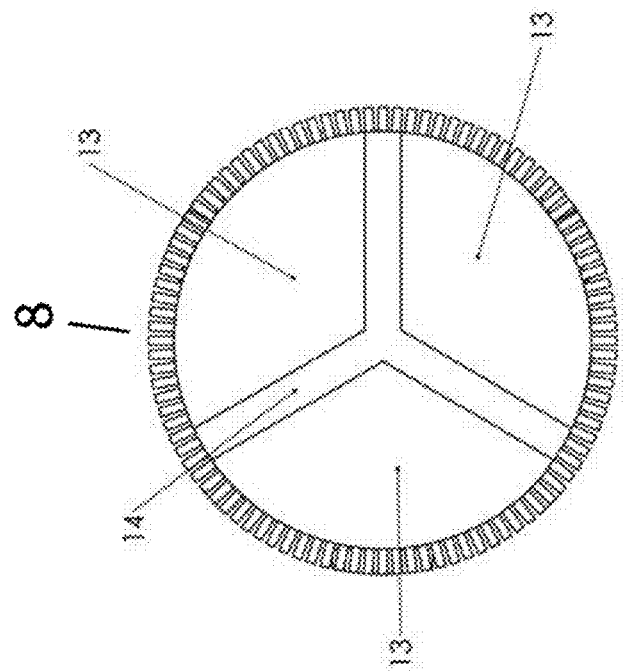
FIGS. 10A and 10B illustrate top and detailed views, respectively, of the light sensing system of the exemplary solar power generation device according to an embodiment.
Figure 10A:
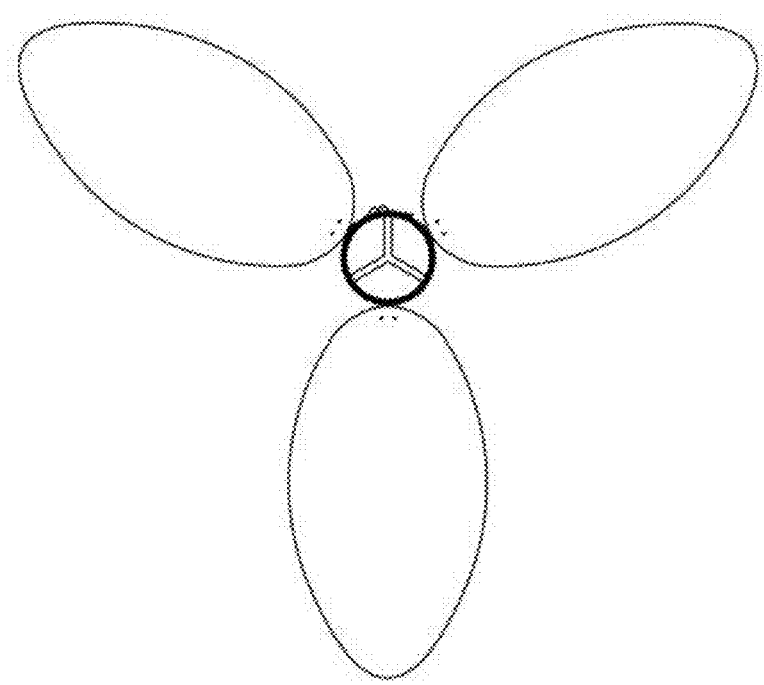

FIGS. 10A and 10B depict top views of the light sensing system 9, which may be located on top of the collector 7, though the light sensing system 9 may be located at any suitable position on the solar power generation device 100. The light sensing system 9 may also be separate from the solar power generation device 100. The light sensing system 9 may include three light sensing elements 13 arranged in a circular pattern. The light sensing elements 13 may be separated from one another by a partition 14. However, in alternative embodiments, the sensing system 9 may include any number and/or type of light sensing elements 13, which may be arranged in any suitable physical configuration that allows the light sensing elements 13 to sense the relative or absolute position of the sun or artificial light source. In addition, the light sensing system 9 may include elements that allow for the tracking of a light source.

Figure 1D:
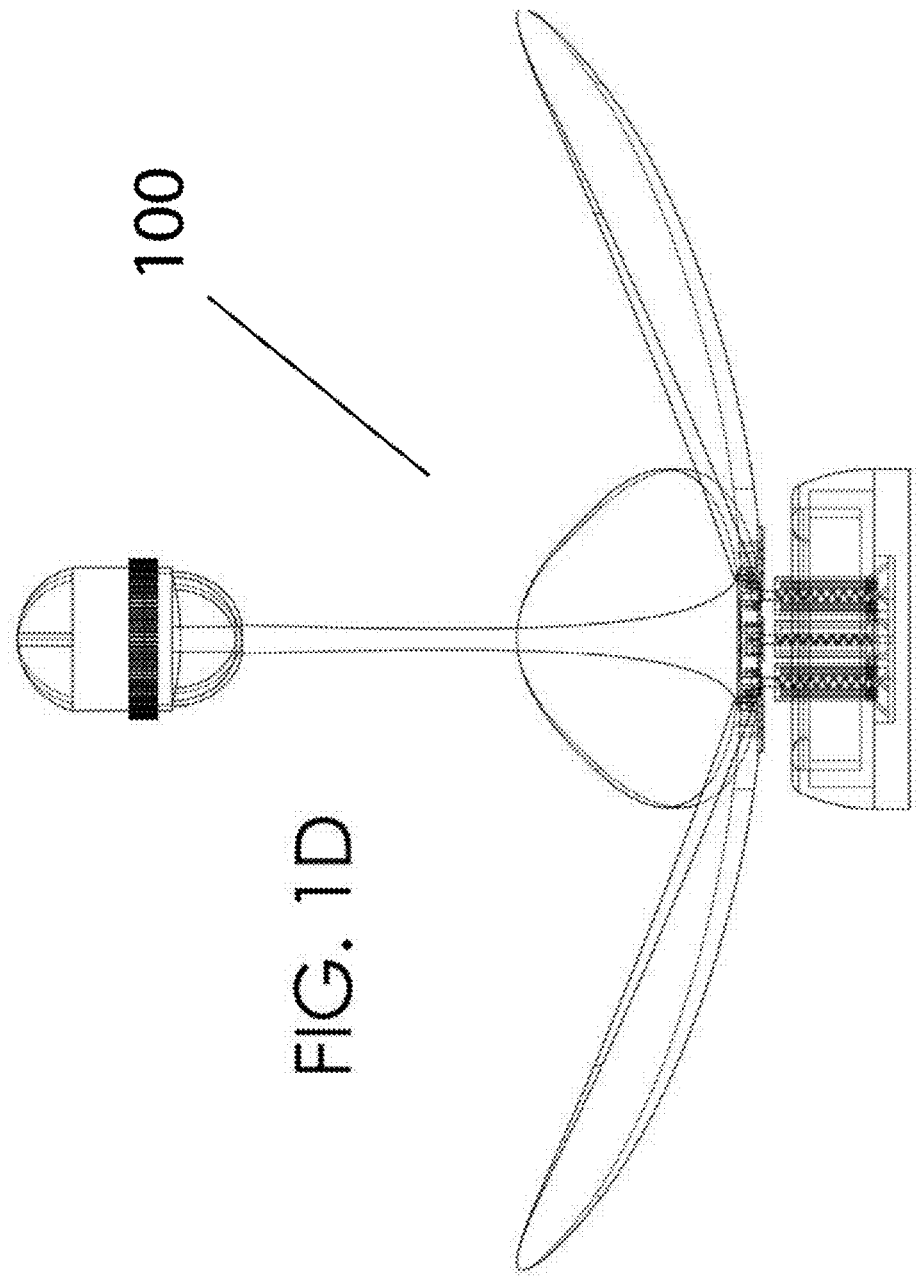
Figure 1E:
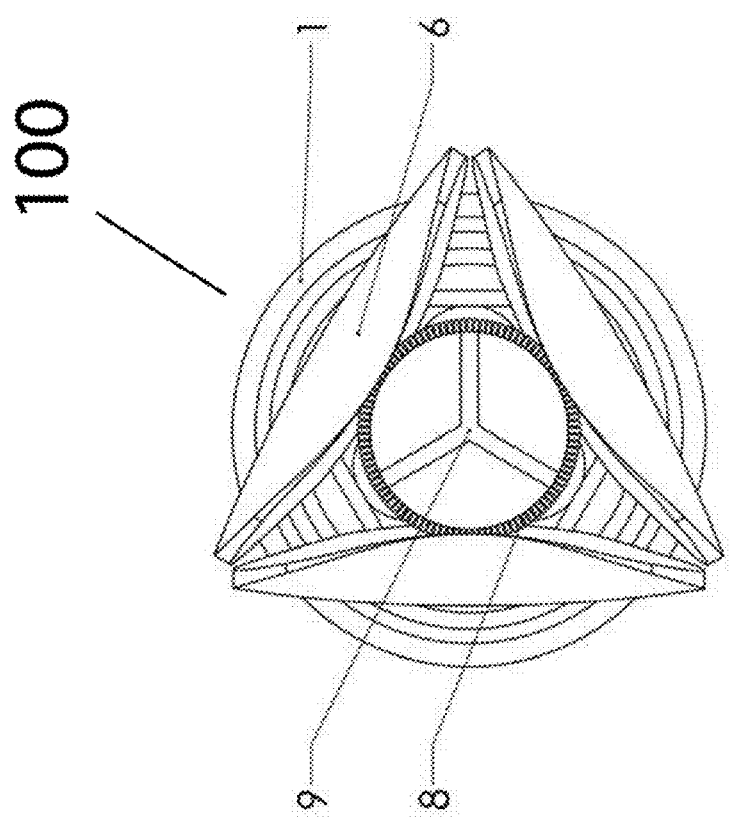
FIGS. 1E and 1F illustrate top views of the exemplary solar power generation device in the closed state and the open state according to an embodiment.
Figure 1F:
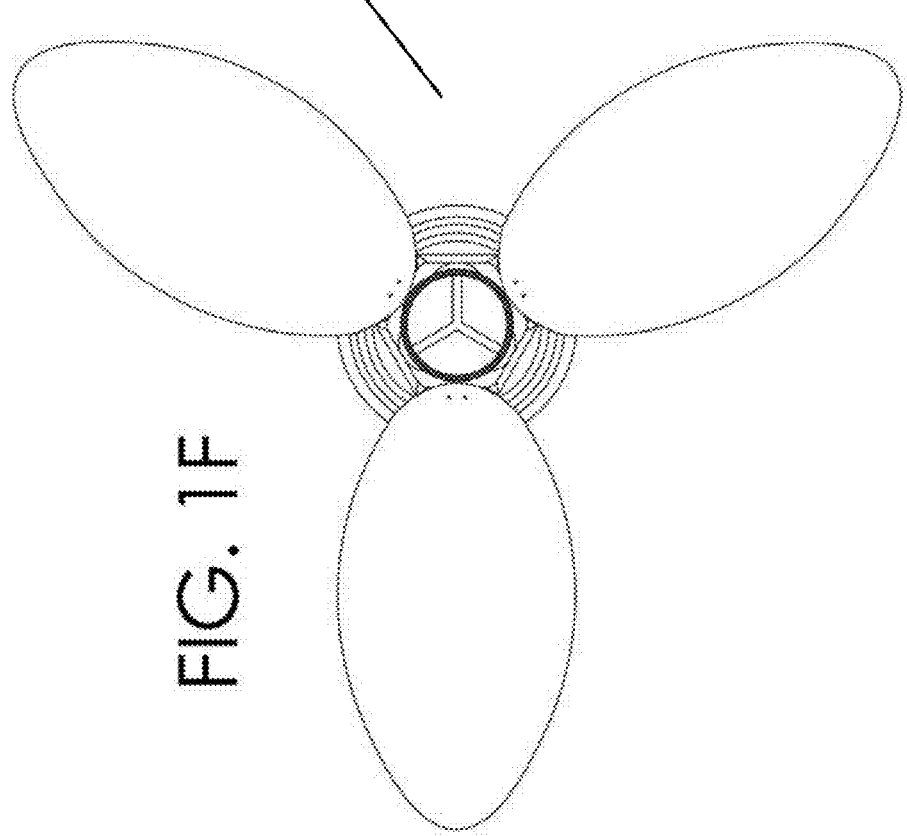
Figure 11A:
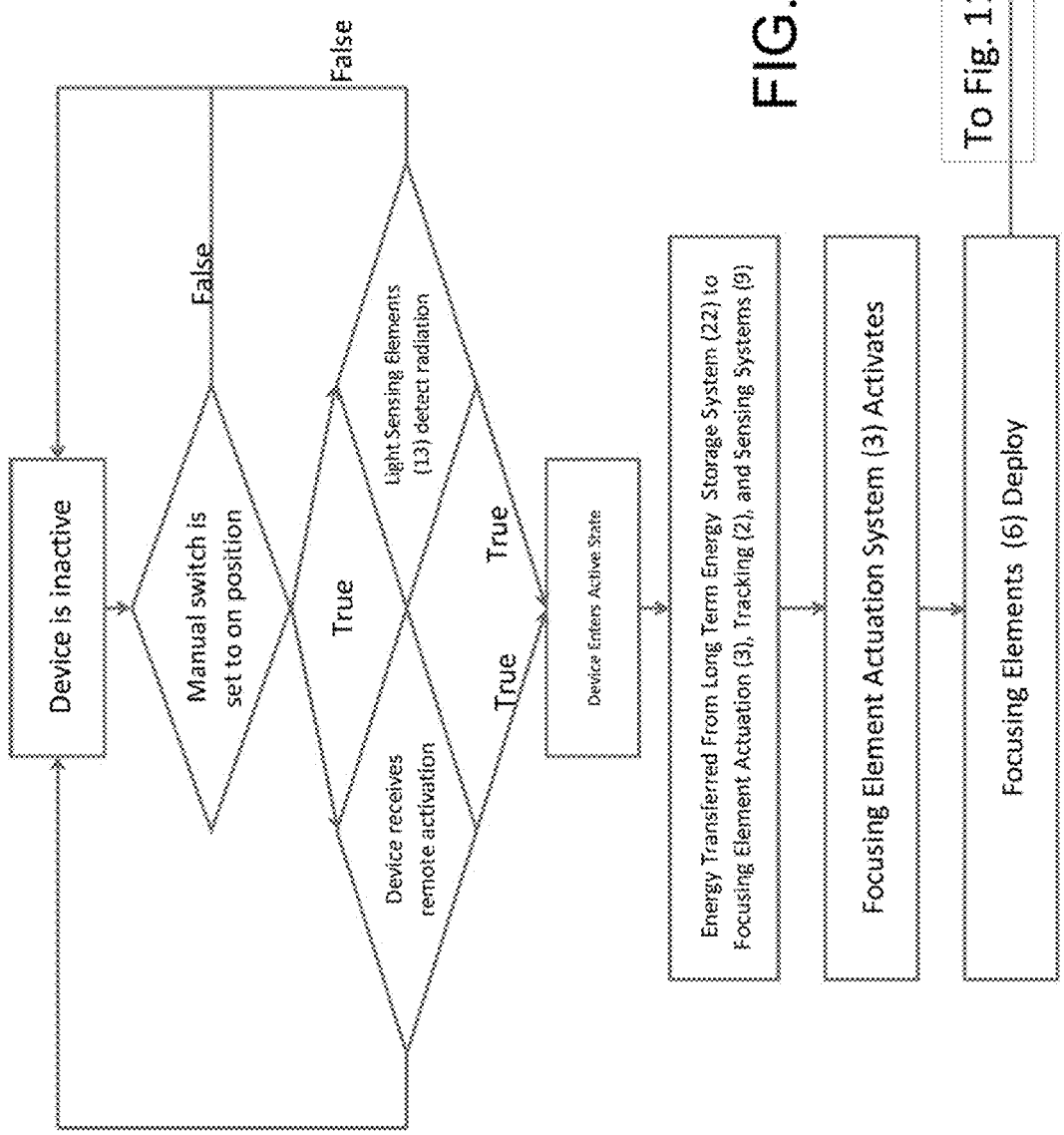
FIGS. 11A and 11B illustrate flow diagrams depicting a method of operation of the exemplary solar power generation device according to an embodiment.
Figure 11B:
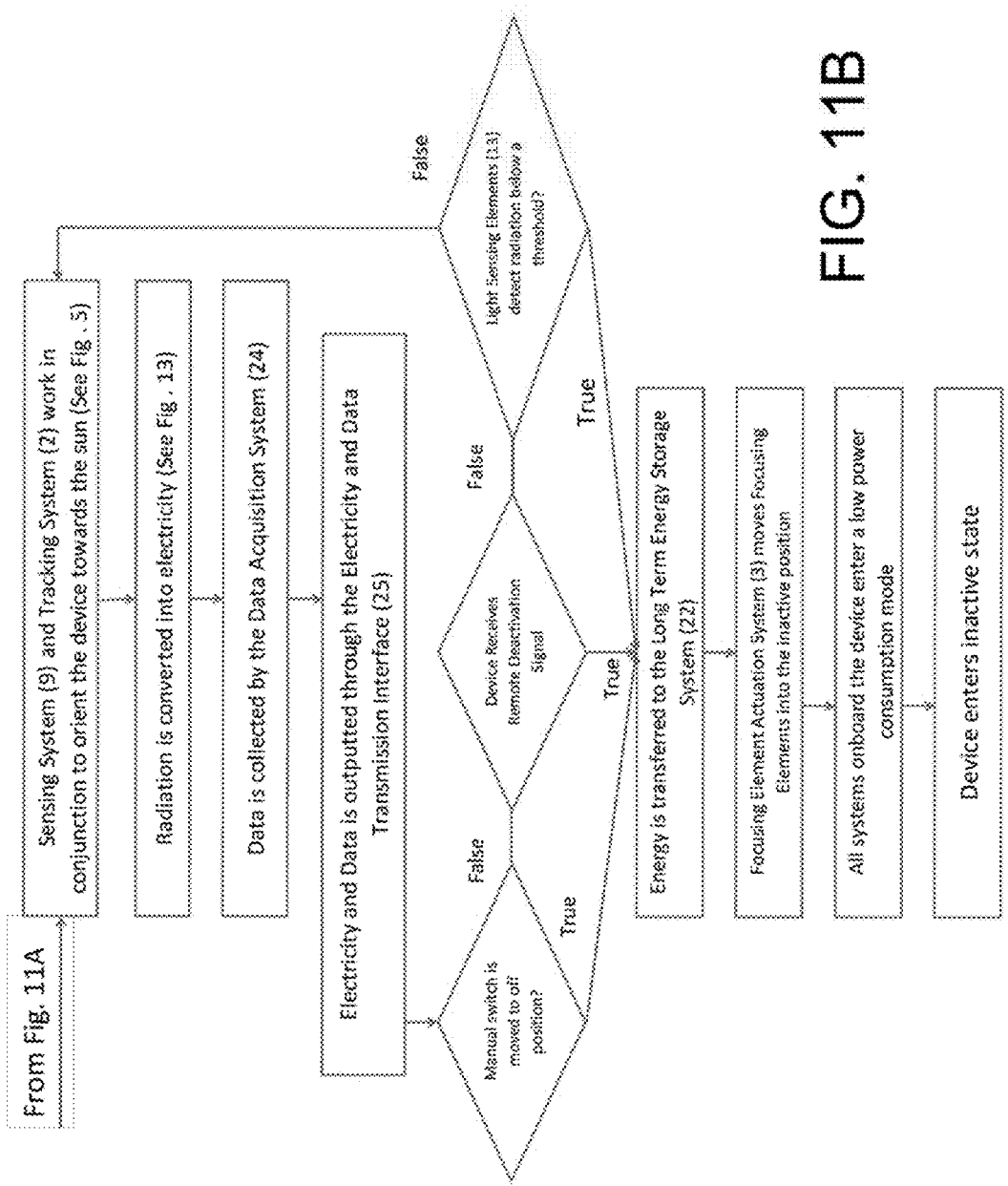

FIGS. 11A and 11B are flow diagrams of an exemplary operation sequence of the solar power generation device 100. The solar power generation device 100 may include two operating states, i.e., an active, or open, state and an inactive, or closed, state. The solar power generation device 100 may also include one or more partially active states. FIGS. 1B, 1D and 1F depict the solar power generation device 100 in the active, or open, state. FIGS. 1A, 1C and 1E depict the solar power generation device 100 in the inactive, or closed, state.

The solar power generation device 100 may be in the inactive state when the device 100 is being transported. This generally makes the solar power generation device 100 more compact, and also protects its components from the external environment. This also generally makes the solar power generation device 100 more compact and, therefore, easier to transport and handle. When the solar power generation device 100 is in the inactive state, the focusing elements 6 may be oriented in a substantially vertical configuration around the support 5, and the device's active components may be placed in a low power consumption mode, inactive state, or turned off. Alternatively, the focusing elements 6 may be oriented in any position in which the total area covered is less than in the active state. In another exemplary embodiment, the focusing elements 6 may be oriented in any position that allows them to be transported easily. Alternatively, the focusing elements 6 may be oriented in any position that provides protection from the external environment.

The solar power generation device 100 may enter an active state when any of the light sensing elements 13 of the light sensing system 9 detects a level of solar energy or radiation above a certain threshold. In the active state, energy may be transferred from the energy storage system to the focusing element actuation system 3, the light sensing system 9, and the tracking system 2. In one embodiment, the focusing element actuation system 3 may function as an energy storage system. The energy storage system may store energy in the form of potential gravitational energy when the solar power generation device 100 is in the inactive state. In other embodiments, the solar power generation device 100 may store the energy in other forms, such as electrical or chemical potential.

As noted above, FIGS. 4A-4F depict the exemplary motion of the focus element actuation system 3 as the solar power generation device 100 transitions from the inactive, or closed, state to the active, or open, state. When the solar power generation device 100 becomes active, the restriction ring 19 is allowed to drop. As the restriction ring 19 drops, the potential gravititional energy is converted into electrical energy that is transmitted to the sensing system 9 and the tracking system 2. For example, the restriction ring 19 may spin an electric motor, which in turn creates electrical energy for the other systems. Energy may also be transferred back into the mechanism for raising and lowering the restriction ring 19. When the restriction ring 19 reaches its final position, the focusing elements 6 are fully deployed and the solar power generation device 100 enters the active state. When entering the inactive state, the solar power generation device 100 may perform a similar process as opening, however, the steps are performed in reverse. The restriction ring 19 may rise, thus closing the deployed focusing elements 6. Once the focusing elements 6 are fully close, the solar power generation device 100 may enter the inactive state.

A manual override (not shown) may be provided to manually activate or inactivate the solar power generation device 100. The manual override may be part of, or separate from, the solar power generation device 100. The manual override may include a wired or wireless connection to the device 100. The manual override may facilitate the safe transportation of the device 100, and may allow the device to be protected from dangers that are known in advance, such as a scheduled chemical spray on a farm. In an alternative embodiment, the transition from the inactive state to the active state may be controlled by a microprocessor that is programmed to keep track of the time of day, the date, orientation of the solar power generation device, and/or location of the solar power generation device.

Figure 12:
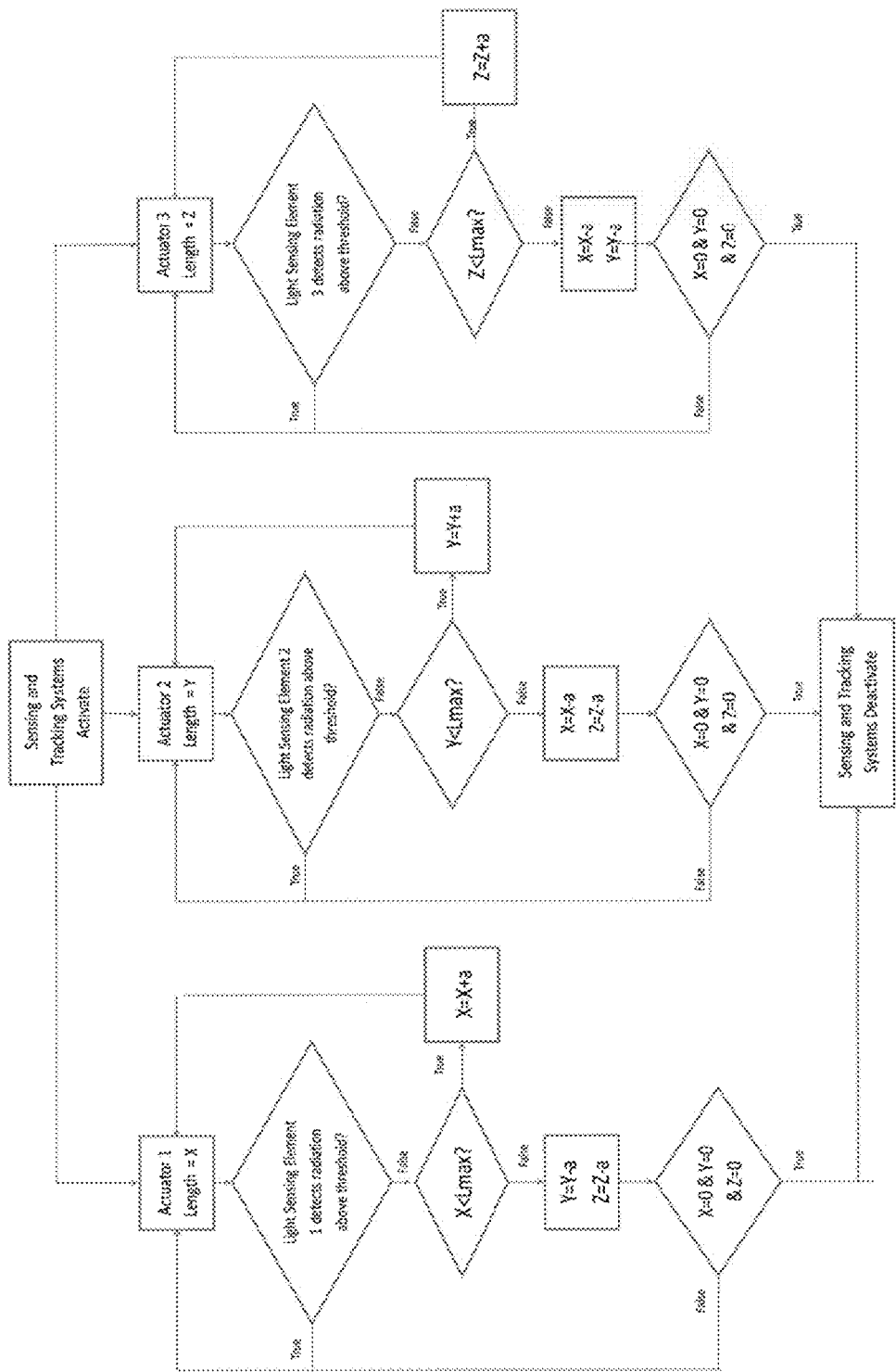
FIG. 12 illustrates a flow diagram depicting a method of operation of the tracking and light sensing systems of the exemplary solar power generation device according to an embodiment.

When the solar power generation device 100 enters the active state, the focusing elements 6 may be deployed (e.g., oriented in a substantially open configuration around the support 5) and the light sensing system 9 and the tracking system 2 may be activated. FIG. 12 is a flow diagram of the operation of the tracking system 2. The light sensing system 9 and the tracking system 2 may work in conjunction to optimally align the focusing elements 6 with the radiation source. Once in the active state, each of the light sensing elements 13 that is not fully exposed to the solar energy or radiation will trigger its corresponding actuator 11 to either lengthen or shorten, depending on the configuration of the system, until it is exposed to radiation above a given level. In trying to achieve optimum exposure to the radiation source, the actions of the three pairs of light sensing elements 13 and actuators 11 will result in the solar power generation device 100 being optimally oriented toward the radiation source.

Figure 5D:
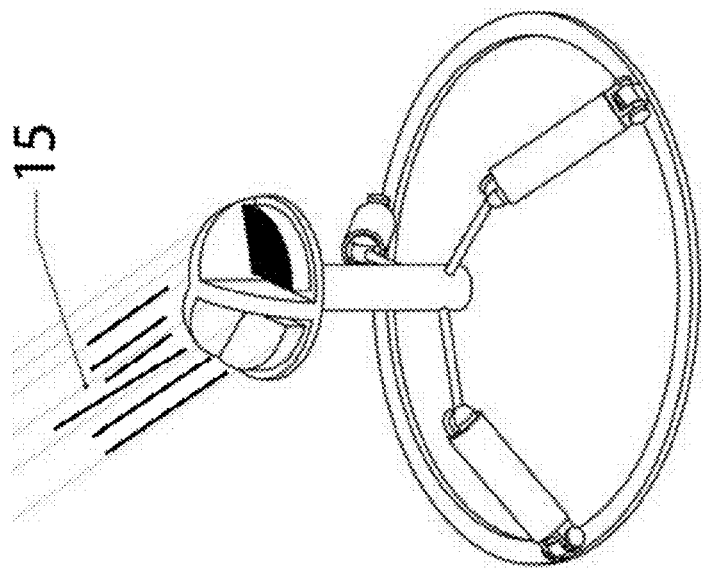
FIGS. 5C and 5D illustrate top and perspective views, respectively, of the tracking system and the light sensing system when the exemplary solar power generation device is not optimally oriented towards a radiation source according to an embodiment.
Figure 5C:
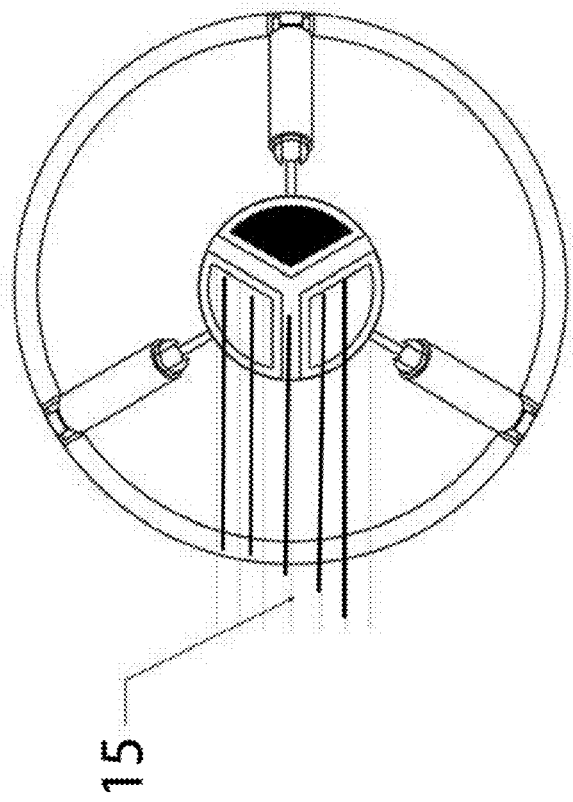
Figure 5F:
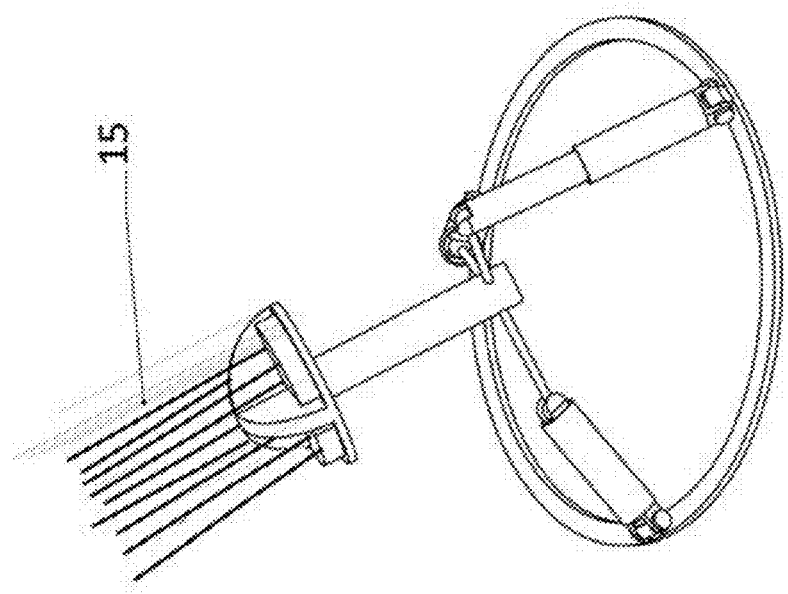
FIGS. 5E and 5F illustrate top and perspective views, respectively, of the tracking system and the light sensing system when the exemplary solar power generation device is optimally oriented towards the radiation source according to an embodiment.
Figure 5E:
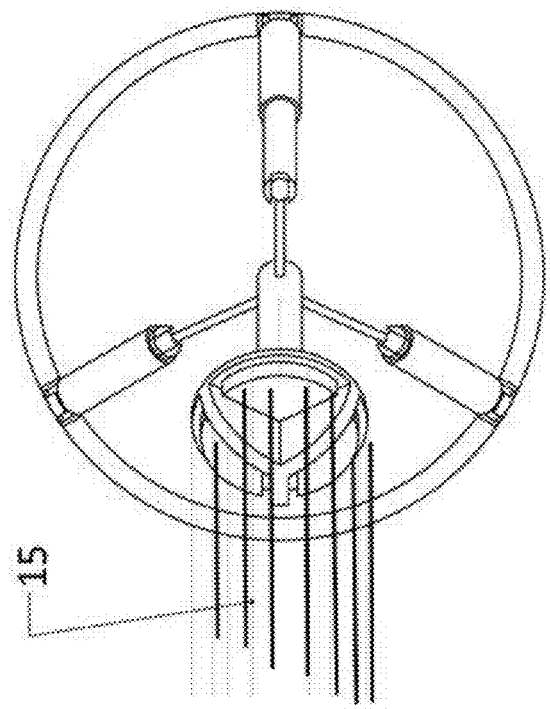

FIGS. 5C and 5D depict top and perspective views, respectively, of the tracking system 2 and the sensing system 9 when the solar power generation device 100 it is not optimally oriented towards the radiation source. FIGS. 5E and 5F depict top and perspective views, respectively, of the tracking system 2 and the sensing system 9 when the solar power generation device 100 is optimally oriented towards the radiation source.

In an alternative embodiment, the light sensing system 9 may work in conjunction with a microprocessor that receives and processes certain inputs, such as the location and orientation of the solar power generation device 100. The processed inputs could then be used to orient the tracking system 2.

Figure 13:
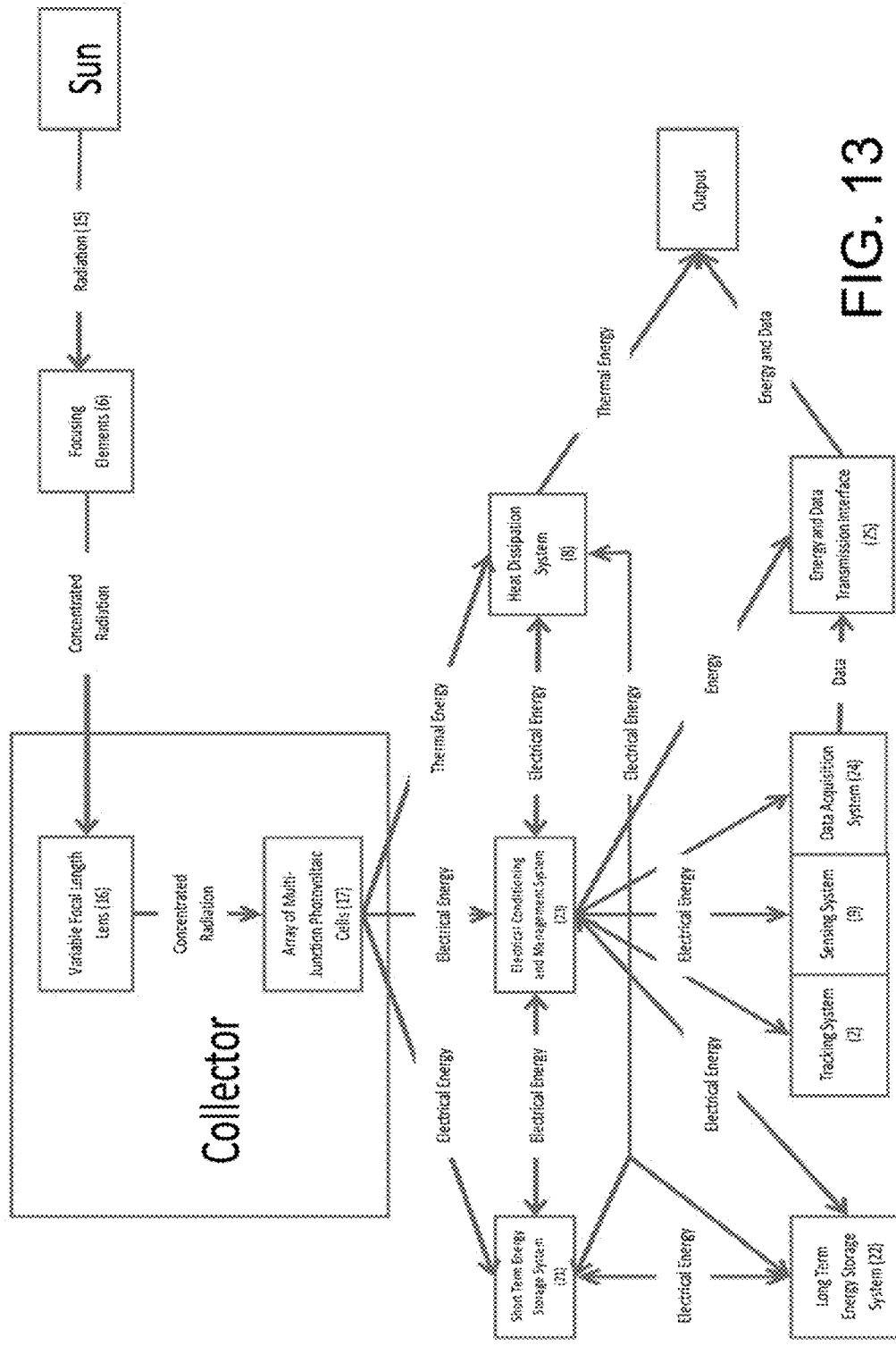
FIG. 13 illustrates a flow diagram depicting a flow of energy within the exemplary solar power generation device.

When the solar power generation device 100 is optimally oriented towards the radiation source, the device 100 may convert the radiation into usable energy, such as electricity. FIG. 13 is a flow diagram of the flow of energy within the solar power generation device 100. Incoming radiation is concentrated, or focused, by the focusing elements 6 onto the array of photovoltaic cells 17 located in the collector 7. Alternatively, the solar power generation device 100 may include a system that utilizes a thermal differential to generate electricity.

In alternative embodiments, a secondary optic may be utilized, and the component(s) for converting the radiation into electricity may be located at any suitable location on the solar power generation device 100. The secondary optic may be a lens with a fixed or adjustable focal length. When light passes through the lens it is projected onto the array of the photovoltaic cells 17. The collector 7 may include a system for measuring the output of the photovoltaic cells 17. The measuring system may be configured to alter the focal length of the lens, thus altering the intensity of the light on the photovoltaic cells 17. The measuring system may further be configured to optimize the output of the photovoltaic cells 17 for any amount of inputted solar radiation. Any excess thermal energy in the photovoltaic cells 17 may be removed by the heat dissipation system 8.

The electrical energy from the array of photovoltaic cells 17 may be transferred to the electrical conditioning and management system 23, which may convert the electricity into a form that may be used by the solar power generation device 100. The electrical conditioning and management system 23 may also convert the electricity into a form that is suitable for output to other active devices that require electricity for operation. The electricity for use within the solar power generation device 100 may be stored in a short-term energy storage system 21, which may include a battery, a capacitor, some combination thereof, or any other suitable energy storage system or device. The electricity may also be stored in the long-term energy storage system 22, which may store energy that is needed to reactivate the solar power generation device 100 after it enters the inactive state. The long-term energy storage system 22 may include the retaining ring 19, which is elevated in order to store the energy. This energy may be stored in the restriction ring 19 without the degradation that is generally common in chemical batteries. When the energy is needed, the restriction ring 19 may be permitted to fall. As the restriction ring 19 falls, it may drive the mechanism (e.g., an electric motor) that is used to raise and lower the restriction ring 19, thereby generating the energy necessary to reactivate the solar power generation device 100. The electricity from the electrical conditioning and management system 23, the short-term energy storage system 21, and the long-term energy storage system 21 may be used to power the tracking system 2, the sensing system 9, and a data acquisition system 24.

The data acquisition system 24 may include one or more sensors that collect data about the external environment of the solar power generation device 100. The sensors may also collect data about the internal operating conditions of the device 100, such as the amount of electricity being generated.

The electrical conditioning and management system 23 and the data acquisition system 24 may be connected to the energy and data transmission interface 25, which may include a circuit for connecting to an electrical junction on the exterior of the solar power generation device 100. An electrical wire or cable may be linked to the junction to transfer energy and data to and from the solar power generation device 100. The electrical wire or cable may be linked to other devices, or to a complimentary device. The energy and data transmission interface 25 may transfer energy and data out of the device 100. Alternatively, energy and data may be transmitted to and from the device 100 wirelessly.

The solar power generation device 100 may be deployed as part of a network. Specifically, the solar power generation device 100 may be connected to one or more other solar power generation devices 100 for the transfer of energy and information. Each device 100 would serve as a node on the network. One or more of the solar power generation devices 100 in the network may be configured to transfer information and/or energy within or out of the network.

The solar power generation device 100 may enter the inactive state when the level of radiation falls below a given threshold. The focusing element actuation system 3 may then move the focusing elements 6 into their inactive position (e.g., in their vertical configuration around the support 5). Energy may then be transferred to the long-term energy storage system 22. The solar power generation device 100 may then become protected from the surrounding environment, and await the required level of radiation required for activation.

As noted above, the transition of the solar power generation device 100 from the inactive state to the active state may be controlled by a microprocessor that is programmed to keep track of the time of day and year. In another embodiment, the focusing elements 6 may not be actuated when the device 100 enters the inactive state.

The disclosed embodiments may also include any number of additional features. For example, the disclosed embodiments may include a method for fastening the solar power generation device 100 to a surface, such as the ground. The solar power generation device 100 may define an external shape or geometry that allows the device 100 to stay upright during windy conditions. The solar power generation device 100 may also have a modular configuration in which different components and systems exist in separate devices. For example, a network of two or more solar power generation devices may be arranged in which both devices collect solar energy and transfer the energy to a separate device for conditioning and storage. This provides for an arrangement where a large number of collection or slave devices are deployed, and any collected energy is transmitted back to a master device for conditioning and/or storage, thus resulting in a network of solar power generation devices. The disclosed embodiments may include sensors for collecting data on the environment surrounding the device. This information may then be transmitted within or outside of the network. The disclosed embodiments may also include the transfer of information and/or energy to other devices 100 when attached to the network. The disclosed embodiments may not require components, such as the focusing elements 6, for concentrating light.

The disclosed embodiments offer a number of advantages. For example, the solar power generation device 100 may be deployed rapidly at a minimal cost and effort. The solar power generation device 100 may be easily scaled (e.g., from a single unit to thousands of units) to accommodate various power requirements and operating conditions. The solar power generation device 100 may include protection features, such as the focusing element actuation system 3 and the focusing elements 6, to mitigate any harsh conditions associated with the surrounding environment.

It will be appreciated that several of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A solar power generation device comprising:
    a base;
    a tracking system mounted to the base and comprising a plurality of actuators;
    a light sensing system configured to independently adjust each of the plurality of actuators based upon the position of a light producing element;
    a solar collector mounted to the tracking system;
    one or more focusing elements mounted around the solar collector; and
    a focusing actuation system configured to automatically open and close the one or more focusing elements in response to detection of light by the light sensing system.

2. The solar power generation device of claim 1, wherein the
    focusing actuation system is connected to the tracking system and configured to adjust the one or more focusing elements based upon the position of the light producing element.

3. The solar power generation device of claim 2, wherein the one or more focusing elements comprise a curved mirror.

4. The solar power generation device of claim 2, wherein the collector comprises at least one of:
    an array of photovoltaic cells; and
    a heat engine.

5. The solar power generation device of claim 2, wherein the tracking system comprises:
    at least one ball joint connected to the plurality of actuators; and
    a moving frame connected to the ball joint and configured to pivot about the base.

6. The solar power generation device of claim 5, wherein the one or more focusing elements are connected to the moving frame.

7. The solar power generation device of claim 1, further comprising an electricity management and conditioning system contained in the base and operably connected to the collector, the electricity management system comprising:
    a short term storage system,
    a long term storage system,
    a data acquisition system, and
    a data and electricity transmission interface.

8. The solar power generation device of claim 7, wherein the data acquisition system is configured to collect data related to the operating conditions of the solar power generation device.

9. The solar power generation device of claim 8, wherein the data and electricity transmission interface is configured to transfer at least one of energy and the collected data from the solar power generation device to another device.

10. The method of claim 1, wherein the light-sensing system comprises a plurality of light-sensing elements, each light-sensing element corresponding to one of the plurality of actuators.

11. The method of claim 10, wherein the light sensing system independently adjusts each of the plurality of actuators based on radiation received by a respective actuator's corresponding light-sensing element.

12. A solar power generation device comprising:
    a base;
    a tracking system comprising a plurality of actuators mounted to the base;
    a solar collector mounted to the tracking system;
    a light sensing system dynamically mounted about the base and configured to independently adjust each of the plurality of actuators based upon the position of a light producing element;
    a plurality of focusing elements mounted to the base and positioned around the light sensing system such that any light reflected by the focusing elements is directed to the solar collector; and
    a focusing actuation system configured to automatically open and close each of the plurality of focusing elements in response to detection of light by the light sensing system.

13. The solar power generation device of claim 12, wherein the focusing actuation system is further configured to adjust the plurality of focusing elements based upon the position of the light producing element.

14. The solar power generation device of claim 13, wherein the plurality of focusing elements comprise a curved mirror.

15. The solar power generation device of claim 12, wherein the collector comprises at least one of:
    an array of photovoltaic cells; and
    a heat engine.

16. The solar power generation device of claim 12, wherein the tracking system comprises:
    at least one ball joint connected to the plurality of actuators; and
    a moving frame connected to the ball joint and configured to pivot about the base.

17. The solar power generation device of claim 16, wherein the plurality of focusing elements are connected to the moving frame.

18. The solar power generation device of claim 12, further comprising an electricity management and conditioning system contained in the base and operably connected to the collector, the electricity management system comprising:
    a short term storage system,
    a long term storage system,
    a data acquisition system, and
    a data and electricity transmission interface.

19. The solar power generation device of claim 18, wherein the data and electricity transmission interface is configured to transfer at least one of energy and any collected data from the solar power generation device to another device.

20. The method of claim 12,
wherein the light-sensing system comprises a plurality of light-sensing elements, each light-sensing element corresponding to one of the plurality of actuators, and
wherein the light sensing system independently adjusts each of the plurality of actuators based on radiation received by a respective actuator's corresponding light-sensing element.

* * * * *